(12) United States Patent
Tatemichi et al.

(10) Patent No.: US 11,845,839 B2
(45) Date of Patent: Dec. 19, 2023

(54) FILM

(71) Applicant: DAIKIN INDUSTRIES, LTD., Osaka (JP)

(72) Inventors: Mayuko Tatemichi, Osaka (JP); Takeshi Hazama, Osaka (JP); Nobuyuki Komatsu, Osaka (JP); Tatsuya Higuchi, Osaka (JP); Kouji Yokotani, Osaka (JP); Akio Higaki, Osaka (JP); Tomohiro Tanaka, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 808 days.

(21) Appl. No.: 16/762,211

(22) PCT Filed: Oct. 29, 2018

(86) PCT No.: PCT/JP2018/040068
§ 371 (c)(1),
(2) Date: May 7, 2020

(87) PCT Pub. No.: WO2019/093175
PCT Pub. Date: May 16, 2019

(65) Prior Publication Data
US 2020/0362127 A1 Nov. 19, 2020

(30) Foreign Application Priority Data

Nov. 8, 2017 (JP) ................. 2017-215659

(51) Int. Cl.
| | |
|---|---|
| B32B 27/28 | (2006.01) |
| C08J 5/18 | (2006.01) |
| H01G 4/18 | (2006.01) |
| H01G 4/33 | (2006.01) |
| G02B 26/00 | (2006.01) |
| C08L 27/20 | (2006.01) |
| C08L 27/18 | (2006.01) |

(52) U.S. Cl.
CPC ................. *C08J 5/18* (2013.01); *H01G 4/18* (2013.01); *H01G 4/33* (2013.01); *B32B 27/28* (2013.01); *B32B 2327/18* (2013.01); *C08J 2327/18* (2013.01); *C08J 2327/20* (2013.01); *C08L 27/18* (2013.01); *C08L 27/20* (2013.01); *C08L 2203/16* (2013.01); *G02B 26/005* (2013.01); *H01G 4/186* (2013.01)

(58) Field of Classification Search
None
See application file for complete search history.

(56) References Cited

U.S. PATENT DOCUMENTS

| | | | |
|---|---|---|---|
| 2002/0086963 A1 | 7/2002 | Higuchi et al. | |
| 2012/0262839 A1 | 10/2012 | Murata | |
| 2018/0223059 A1 | 8/2018 | Kanemura et al. | |
| 2019/0382544 A1* | 12/2019 | Yokotani | ........... H01G 4/18 |

FOREIGN PATENT DOCUMENTS

| | | |
|---|---|---|
| EP | 3 508 519 A1 | 7/2019 |
| EP | 3 556 798 A1 | 10/2019 |
| JP | 61-167527 A | 7/1986 |
| JP | 8-176366 A | 7/1996 |
| JP | 2002-219750 A | 8/2002 |
| JP | 2002-240144 A | 8/2002 |
| JP | 2005-186370 A | 7/2005 |
| JP | 2011-29294 A | 2/2011 |
| WO | 2017/014123 A1 | 1/2017 |

OTHER PUBLICATIONS

International Preliminary Report on Patentability dated May 12, 2020 in International Application No. PCT/JP2018/040068.
Communication dated Jun. 18, 2021, from the European Patent Office in application No. 18876298.3.
International Search Report for PCT/JP2018/040068, dated Dec. 18, 2018.

* cited by examiner

*Primary Examiner* — Richard A Huhn
(74) *Attorney, Agent, or Firm* — Sughrue Mion, PLLC

(57) ABSTRACT

A film having a dielectric dissipation factor at a frequency of 1 kHz and 160° C. of 0.02% or lower and a dielectric breakdown strength at 160° C. of 400 V/μm or higher. Also disclosed is a film including at least one fluoropolymer selected from a tetrafluoroethylene/perfluoro(alkyl vinyl ether) copolymer and a tetrafluoroethylene/hexafluoropropylene copolymer, the fluoropolymer having a crystallinity of 65% or higher.

7 Claims, No Drawings

FILM

This application is a National Stage of International Application No. PCT/JP2018/040068 filed Oct. 29, 2018, claiming priority based on Japanese Patent Application No. 2017-215659 filed Nov. 8, 2017.

TECHNICAL FIELD

The invention relates to films.

BACKGROUND ART

Films for film capacitors have been conventionally proposed to contain polyvinylidene fluoride (PVdF) due to its high permittivity. Methods of using a copolymer containing vinylidene fluoride (VdF) and tetrafluoroethylene (TFE) for a film have also been disclosed.

Patent Literature 1, for example, discloses a film containing a VdF/TFE copolymer, having a relative permittivity of 8 or more at a frequency of 1 kHz at 30° C., wherein the rate of change is −8 to +8% as calculated from a relative permittivity A at a frequency of 1 kHz at 30° C. and a relative permittivity B at a frequency of 1 kHz at 150° C. according to the following formula: Rate of change (%)= (B−A)/(A×100).

Patent Literature 2 discloses a fluororesin film of high mechanical strength, which has a dielectric constant of at most 5, and which has a tensile break strength of at least 40 MPa in each of MD and TD directions.

CITATION LIST

Patent Literature

Patent Literature 1: WO 2017/014123
Patent Literature 2: JP 2002-219750 A

SUMMARY OF INVENTION

Technical Problem

Power semiconductors are used in various applications such as home appliances and vehicle-mounted equipment. The appearance of silicon carbide (SiC) semiconductors, which can be driven at higher temperatures than conventionally used silicon-based semiconductors, requires stable performance at high temperatures of film capacitors that are used as peripheral members of power semiconductors. All conventional films for film capacitors unfortunately have a high dielectric dissipation factor or a low volume resistivity or dielectric breakdown strength at high temperatures. This causes a demand for a film having all of these properties at sufficient levels.

In view of the situation, the invention aims to provide a film having a low dielectric dissipation factor and an excellent dielectric breakdown strength at high temperatures.

Solution to Problem

The invention relates to a film having a dielectric dissipation factor at a frequency of 1 kHz and 160° C. of 0.02% or lower and a dielectric breakdown strength at 160° C. of 400 V/μm or higher (hereinafter, also referred to as a "first film of the invention").

The first film of the invention preferably has a volume resistivity at 160° C. of 1.0E16 Ω·cm or more.

The first film of the invention preferably contains a polymer.

The polymer preferably has a crystallinity of 65% or higher.

The polymer is preferably a fluoropolymer having a melting point of 270° C. or higher.

The polymer is preferably a fluoropolymer having a relative permittivity of 2.5 or lower.

The polymer preferably includes at least one fluoropolymer selected from the group consisting of a tetrafluoroethylene/perfluoro(alkyl vinyl ether) copolymer and a tetrafluoroethylene/hexafluoropropylene copolymer.

The invention also relates to a film containing at least one fluoropolymer selected from the group consisting of a tetrafluoroethylene/perfluoro(alkyl vinyl ether) copolymer and a tetrafluoroethylene/hexafluoropropylene copolymer, the fluoropolymer having a crystallinity of 65% or higher (hereinafter, also referred to as a "second film of the invention").

The film of the invention preferably has a thickness of 1 to 100 μm.

The film of the invention is preferably intended to be used in a film capacitor, an electrowetting device, a circuit board, an electric wire cable, a high frequency printed circuit board, a sealing material for an electronic component, or for electric insulation in a motor or transformer.

Hereinafter, the "film of the invention" encompasses both the first film and second film of the invention.

Advantageous Effects of Invention

The film of the invention, which has any of the above structures, has a low dielectric dissipation factor and an excellent dielectric breakdown strength at high temperatures.

DESCRIPTION OF EMBODIMENTS

The invention is described in detail below.

The first film of the invention has a dielectric dissipation factor at a frequency of 1 kHz and 160° C. of 0.02% or lower. The dielectric dissipation factor is more preferably 0.01% or lower. The lower limit of the dielectric dissipation factor is not limited, is preferred to be as low as possible, and may be 0%, for example.

The dielectric dissipation factor is a value measured at a frequency of 1 kHz and 160° C. using an LCR meter, using a sample prepared by depositing aluminum with a diameter of 50 mm on a surface of the film and depositing aluminum on the whole opposite surface.

The first film of the invention has a dielectric breakdown strength at 160° C. of 400 V/μm or higher, preferably 450 V/μm or higher, more preferably 500 V/μm or higher. The upper limit of the dielectric breakdown strength is not limited, is preferred to be as high as possible, and may be 1000 V/μm or 800 V/μm, for example.

The dielectric breakdown strength is determined as follows. The film is placed on a lower electrode and a 500-g weight having a diameter of 25 mm is placed thereon as an upper electrode. A voltage applied between the ends is increased at a rate of 100 V/sec, and the voltage at break is measured. The number of measurement operations is 50. The measured values of the respective operations, excluding the five highest values and the five lowest values, are averaged. This average is divided by the thickness, whereby the dielectric breakdown strength is obtained.

The first film of the invention preferably has a volume resistivity at 160° C. of 1.0E16 Ω·cm or higher, more preferably 2.0E16 Ω·cm or higher, still more preferably 5.0E16 Ω·cm or higher, particularly preferably 1.0E17 Ω·cm. The upper limit of the volume resistivity is not limited, is preferred to be as high as possible, and may be 1.0E18 Ω·cm, for example.

The volume resistivity is determined as follows. That is, the film is held between a lower electrode and an upper electrode placed in a constant temperature chamber (160° C., 25% RH) and an electric field at 50 V/μm is applied to the film using a digital super megohmmeter/microammeter. The leak current is measured, and thereby the volume resistivity is calculated.

The first film and the later-described second film of the invention each preferably have a thickness of 100 μm or smaller, more preferably 30 μm or smaller, still more preferably 20 μm or smaller. The thickness may be 1 μm or greater. The thickness commonly used is 2 μm or greater and 8 μm or smaller or 2 μm or greater and 5 μm or smaller.

The thickness can be measured with a digital thickness meter.

The first film of the invention preferably contains a polymer, more preferably a fluoropolymer. The film of the invention may be an organic film.

The first film of the invention preferably contains a polymer having a crystallinity of 65% or higher. The crystallinity is more preferably 70% or higher, still more preferably 75% or higher, particularly preferably 80% or higher. The upper limit of the crystallinity may be, but is not limited to, 100%.

The crystallinity is determined by multiple peak separation using an X-ray diffractometer. Specifically, films are stacked to provide a measurement sample having a total thickness of 40 μm or greater. This measurement sample is mounted on a sample holder and analyzed using the X-ray diffractometer, so that a diffraction spectrum whose diffraction angle (2θ) is in a range of 10° to 50° is obtained. The peaks of the crystal portion and amorphous portion in the diffraction spectrum are resolved into independent peaks. The crystallinity is then calculated from the integral intensity (area) of each peak. Specifically, the crystallinity is calculated from the proportional integral intensity of the peak of the crystal portion in the integral intensity of all the peaks. These conditions and ranges shall apply to all the polymers.

The first film of the invention preferably has a half width of the crystal peak of 0.5 to 1.5 in the X-ray diffraction.

The half width is determined as follows. The peak in the spectrum obtained with the X-ray diffractometer is resolved into the crystal peak and the amorphous halo by peak separation. With the height from the background of the resulting crystal peak to the peak top defined as h, the half width is determined from the width of the crystal peak at the portion corresponding to h/2.

Examples of the fluoropolymer include TFE/perfluoro (alkyl vinyl ether) (PAVE) copolymers (PFAs) and TFE/ hexafluoropropylene (HFP) copolymers (FEPs), In order to achieve a film having a dielectric dissipation factor of 0.02% or lower, a dielectric breakdown strength of 400 V/μm or higher at high temperatures, and a volume resistivity at high temperatures, the film of the invention preferably contains a fluoropolymer, more preferably a fluoropolymer containing a TFE unit.

The fluoropolymer preferably has a melting point of 270° C. or higher, more preferably 280° C. or higher. The upper limit thereof is not limited and may be 350° C., for example.

The melting point is determined from the peak on an endothermic curve obtained by thermal analysis at a temperature-increasing rate of 10° C./min using a differential scanning calorimeter in conformity with ASTM D-4591.

The fluoropolymer preferably has a relative permittivity of 2.5 or lower, more preferably 2.3 or lower, still more preferably 2.2 or lower, while preferably 2.0 or higher, more preferably 2.1 or higher.

The relative permittivity is a value calculated from the following formula: $C = \varepsilon \times \varepsilon_0 \times S/d$, wherein C is the capacitance measured with an LCR meter, using a sample prepared by depositing aluminum with a diameter of 50 mm on a surface of the film and depositing aluminum on the whole opposite surface using a heat press; S is the electrode area; d is the film thickness; and $\varepsilon_0$ is the permittivity of vacuum.

In order to provide a film having a lower dielectric dissipation factor and an excellent volume resistivity and dielectric breakdown strength at high temperatures, the fluoropolymer more preferably includes at least one selected from the group consisting of a PFA and a FEP, and is still more preferably a PFA.

The PAVE unit constituting the PFA may include at least one selected from the group consisting of those represented by the following formula (1):

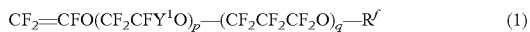  (1)

(wherein $Y^1$ is F or $CF_3$; $R^f$ is a C1-C5 perfluoroalkyl group; p is an integer of 0 to 5; and q is an integer of 0 to 5) and those represented by the following formula (2):

  (2)

(wherein Xs are the same as or different from each other, and are each F or $CF_3$; $R^1$ is a linear or branched C1-C6 perfluoroalkyl group, or a C5-C6 cyclic perfluoroalkyl group).

Specific examples thereof include perfluoro(methyl vinyl ether) (PMVE), perfluoro(ethyl vinyl ether) (PEVE), perfluoro(propyl vinyl ether) (PPVE), and perfluoro(butyl vinyl ether) (PBVE).

The PAVE is preferably one having a bulky side chain, specifically preferably PPVE.

The PFA preferably contains a polymerized unit based on PAVE in an amount of 1.0 to 10% by mass of all the polymerized units.

The amount of the polymerized unit based on PAVE is more preferably 2.0% by mass or more, still more preferably 3.5% by mass or more, particularly preferably 4.0% by mass or more, most preferably 5.0% by mass or more, while more preferably 8.0% by mass or less, still more preferably 7.0% by mass or less, particularly preferably 6.5% by mass or less, most preferably 6.0% by mass or less, of all the polymerized units. The amount of the polymerized unit based on PAVE is determined by $^{19}$F-NMR.

The PFA preferably satisfies that the sum of the polymerized units based on TFE and PAVE represents 90 mol % or more, more preferably 95 mol % or more, of all the polymerized units. The PFA may consist only of the polymerized units based on TFE and PAVE.

The PFA contains no HFP unit.

The PFA may contain 400 or less unstable end groups per $10^6$ main chain carbon atoms. Examples of the unstable end groups include —COF, —COOH, —$CF_2$H, —$COOCH_3$, —$CH_2OH$, —$CONH_2$, and —CF=$CF_2$. The above number of unstable end groups means the sum of these unstable end groups. The number may be 20 or smaller, and may be 10 or smaller. The lower limit thereof may be 0. In order to achieve a low dielectric dissipation factor within a high frequency region (10 GHz or higher), a PFA containing 20 or less unstable end groups per $10^6$ main chain carbon atoms is particularly preferred.

The number of unstable end groups can be determined by infrared spectroscopy.

First, the copolymer is melt-extruded and a film having a thickness of 0.25 to 0.3 mm is produced. This film is analyzed by Fourier transform infrared spectroscopy, so that an infrared absorption spectrum of the copolymer is obtained. This spectrum is then compared with a base spectrum of a polymer that is completely fluorinated and thus contains no unstable end group. Thereby, a difference spectrum is obtained. Based on the absorption peak of a specific unstable end group in the difference spectrum, the number N of unstable end groups per $10^6$ carbon atoms in the copolymer is calculated by the following formula (A):

$$N=I\times K/t \qquad (A)$$

wherein
- I: absorbance
- K: correction coefficient
- t: thickness of film (mm).

The fluorination treatment can be performed by a known method. For example, a method can be employed in which a copolymer obtained through polymerization is made contact with a fluorine-containing compound. Examples of the fluorine-containing compound (fluorine radical source) include $F_2$ gas, $CoF_3$, $AgF_2$, $UF_6$, $OF_2$, $N_2F_2$, $CF_3OF$, and halogen fluorides (e.g., $IF_5$, $ClF_3$), with $F_2$ gas being preferred.

The fluorine radical source such as $F_2$ gas may have a concentration of 100% or may be diluted by mixing with inactive gas to have a concentration of 5 to 50% by mass, preferably 15 to 30% by mass. Examples of the inactive gas include nitrogen gas, helium gas, and argon gas.

The fluorination treatment may be performed in any conditions. For example, the fluorination treatment may be performed by bringing the copolymer in a molten state into contact with the fluorine-containing compound. Still, the fluorination treatment is usually performed at a temperature not higher than the melting point of the copolymer, preferably at a temperature between 20° C. and 220° C., more preferably between 100° C. and 200° C.

The PFA preferably has a melting point of 280° C. to 322° C.

The melting point is more preferably 290° C. or higher, while more preferably 315° C. or lower.

The melting point is the temperature corresponding to the maximum value on a heat-of-fusion curve obtained at a temperature-increasing rate of 10° C./min using a differential scanning calorimeter (DSC).

The PFA preferably has a glass transition temperature (Tg) of 70° C. to 110° C. The glass transition temperature is more preferably 80° C. or higher, while more preferably 100° C. or lower.

The glass transition temperature is a value obtained by dynamic viscoelasticity measurement.

The PFA may be produced by any conventionally known method such as a method including mixing monomers to form structural units of the polymer and additives such as a polymerization initiator as appropriate and performing emulsion polymerization or suspension polymerization.

The FEP contains a TFE unit and a HFP unit.

In the FEP, the TFE unit and the HFP unit preferably give a mass ratio (TFE/HFP) of (70 to 99)/(1 to 30) (% by mass), more preferably (85 to 95)/(5 to 15) (% by mass).

The FEP is also preferably a TFE/HFP/PAVE copolymer that contains a PAVE unit in addition to the TFE unit and the HFP unit. Examples of the PAVE unit contained in the FEP are the same as described for the PAVE unit constituting the PFA. Preferred among those is PPVE.

The FEP preferably contains the sum of the polymerized units based on TFE, HFP, and PAVE in an amount of 90 mol % or more, more preferably 95 mol % or more, of all the polymerized units. The FEP may consist only of the polymerized units based on TFE and HFP or may consist only of the polymerized units based on TFE, HFP, and PAVE.

When the FEP is a TFE/HFP/PAVE copolymer, the mass ratio (TFE/HFP/PAVE) is preferably (70 to 99.8)/(0.1 to 25)/(0.1 to 25) (% by mass). The mass ratio within the above range achieves better heat resistance.

The mass ratio (TFE/HFP/PAVE) is more preferably (75 to 98)/(1.0 to 15)/(1.0 to 10) (% by mass).

The TFE/HFP/PAVE copolymer contains the HFP unit and the PAVE unit in a total amount of 1% by mass or more.

The TFE/HFP/PAVE copolymer preferably contains the HFP unit in an amount of 25% by mass or less of all the monomer units. The HFP unit in an amount within the above range achieves better heat resistance. The amount of the HFP unit is more preferably 20% by mass or less, still more preferably 18% by mass or less, particularly preferably 15% by mass or less, while preferably 0.1% by mass or more, more preferably 1% by mass or more, particularly preferably 2% by mass or more.

The amount of the HFP unit can be determined by $^{19}$F-NMR.

In the TFE/HFP/PAVE copolymer, the amount of the PAVE unit is more preferably 20% by mass or less, still more preferably 10% by mass or less, particularly preferably 3% by mass or less, while preferably 0.1% by mass or more, more preferably 1% by mass or more. The amount of the PAVE unit can be determined by $^{19}$F-NMR.

The FEP may further contain a different ethylenic monomer (α) unit.

The different ethylenic monomer (α) unit may be any monomer unit copolymerizable with the TFE unit and the HFP unit, and further the PAVE unit for a TFE/HFP/PAVE copolymer. Examples thereof include fluorine-containing ethylenic monomers such as vinyl fluoride (VF), VdF, and chlorotrifluoroethylene (CTFE), and non-fluorinated ethylenic monomers such as ethylene, propylene, and alkyl vinyl ethers.

In the case where the copolymer is a copolymer of TFE, HFP, PAVE, and a different ethylenic monomer (α), the copolymer preferably has a TFE/HFP/PAVE/different ethylenic monomer (α) mass ratio of (70 to 98)/(0.1 to 25)/(0.1 to 25)/(0.1 to 25) (% by mass), more preferably (70 to 98)/(0.1 to 25)/(0.1 to 20)/(0.1 to 15) (% by mass), still more preferably (70 to 98)/(0.1 to 20)/(0.1 to 10)/(0.1 to 5) (% by mass).

The TFE/HFP copolymer contains the polymerized units other than the TFE unit in a total amount of 1% by mass or more.

The FEP preferably has a melting point of 270° C. to 322° C. The melting point is more preferably 300° C. or lower, still more preferably 280° C. or lower.

The melting point is the temperature corresponding to the maximum value on a heat-of-fusion curve obtained at a temperature-increasing rate of 10° C./min using a differential scanning calorimeter (DSC).

The FEP preferably has a glass transition temperature (Tg) of 60° C. to 110° C., more preferably 65° C. or higher, while more preferably 100° C. or lower. The glass transition temperature is a value obtained by dynamic viscoelasticity measurement.

The FEP may be produced by any conventionally known method such as a method including mixing monomers to form structural units of the polymer and additives such as a polymerization initiator as appropriate and performing emulsion polymerization, solution polymerization, or suspension polymerization.

The PFA and FEP each preferably have a melt flow rate (MFR) of 0.1 to 100 g/10 min, more preferably 0.1 to 50 g/10 min.

The MFR is the mass (g/10 min) of a polymer that flows out of a nozzle (inner diameter: 2 mm, length: 8 mm) per 10 minutes at 297° C. and a 5-kg load in conformity with ASTM D3307-01.

The PFA and FEP each preferably have a pyrolysis starting temperature (1% mass reduction temperature) of 360° C. or higher. A more preferred lower limit is 370° C. The upper limit of the pyrolysis starting temperature may be 410° C., for example, as long as it falls within the above range.

The pyrolysis starting temperature is the temperature at which 1% by mass of a copolymer subjected to a heating test is decomposed, and is a value obtainable by measuring the temperature at which the mass of the copolymer subjected to the heating test is reduced by 1% by mass, using a thermogravimetric/differential thermal analyzer (TG-DTA).

The PFA and FEP preferably have a storage elastic modulus (E') at 170° C. of 60 to 400 MPa as measured by dynamic viscoelasticity analysis.

The storage elastic modulus is a value measured at 170° C. by dynamic viscoelasticity analysis. More specifically, the storage elastic modulus is a value measured on a sample having a length of 30 mm, width of 5 mm, and thickness of 0.25 mm, using a dynamic viscoelasticity analyzer in a tensile mode with a clamp width of 20 mm and at a measurement temperature of 25° C. to 250° C., a temperature-increasing rate of 2° C./min, and a frequency of 1 Hz. The storage elastic modulus (E') at 170° C. is more preferably 80 to 350 MPa, still more preferably 100 to 350 MPa.

Test samples may be prepared by, for example, setting the molding temperature to a temperature higher than the melting point of the copolymer by 50° C. to 100° C., preparing a film having a thickness of 0.25 mm under a pressure of 3 MPa, and cutting the film into pieces of 30 mm length and 5 mm width.

The PFA and FEP may be a fluororesin.

The first film of the invention preferably contains a fluoropolymer and has a crystallinity of 65% or higher. Use of a specific polymer can reduce the dielectric dissipation factor at high temperatures. Stretching the film at a specific area ratio or higher enables the polymer to have a crystallinity of 65% or higher. Thereby, the resulting film can have a much better dielectric breakdown strength and volume resistivity.

The first film of the invention more preferably contains at least one fluoropolymer selected from the group consisting of a PFA and a FEP and has a crystallinity of 65% or higher, still more preferably contains at least one fluoropolymer selected from the group consisting of a PFA and a FEP and has a crystallinity of 70% or higher, further more preferably contains a PFA and has a crystallinity of 75% or higher, and particularly preferably contains a PFA and has a crystallinity of 80% or higher.

The second film of the invention contains at least one fluoropolymer selected from the group consisting of a TFE/PAVE copolymer (PFA) and a TFE/HFP copolymer (FEP), and the fluoropolymer has a crystallinity of 65% or higher.

The second film of the invention, having the above structure, has a low dielectric dissipation factor and an excellent dielectric breakdown strength at high temperatures. The second film also has an excellent volume resistivity at high temperatures.

In the second film of the invention, use of a specific polymer can reduce the dielectric dissipation factor at high temperatures. Stretching the specific polymer at a specific area ratio or higher enables the resulting film to have a crystallinity of 65% or higher. Thereby, the film can have improved dielectric breakdown strength and volume resistivity.

As for the PFA and FEP, the PFAs and FEPs usable for the first film of the invention are suitable. The fluoropolymer is preferably a PFA.

The crystallinity is preferably 70% or higher, more preferably 75% or higher, still more preferably 80% or higher. The upper limit of the crystallinity may be 100%, although not being limited thereto. The crystallinity of the polymer can be determined by the method for calculating the crystallinity of the polymer of the first film of the invention.

Any other preferred embodiments described for the first film of the invention can be applied to the second film of the invention.

The film of the invention, when containing a PFA and/or an FEP, may further contain an additional polymer. Preferred examples of the additional polymer include: polycarbonate (PC), polyester, polyethylene terephthalate (PET), polyethylene naphthalate (PEN), silicone resin, polyether, polyvinyl acetate, polyethylene, and polypropylene (PP) for improved mechanical strength; and polyvinylidene fluoride (PVdF), vinylidene fluoride (VdF)/hexafluoropropylene (HFP) copolymers, poly(meth)acrylate, epoxy resin, polyethylene oxide, polypropylene oxide, polyphenylene oxide (PPO), polyphenylene sulfide (PPS), polyamide (PA), polyimide (PI), polyamideimide (PAI), PC, polystyrene, and polybenzimidazole (PBI) for increased strength. Examples thereof also include cellulose acetate propionate and cellulose acetate butyrate.

The PFA and/or FEP and the additional polymer preferably give a mass ratio of 50/50 to 99/1, more preferably 75/25 to 99/1.

In order to prevent blocking of the film without reducing the mechanical strength of the film, the film of the invention may also contain silica. The amount of silica is preferably 0.01 to 10 parts by mass, more preferably 0.1 parts by mass or more, while more preferably 5 parts by mass or less, still more preferably 2 parts by mass or less, relative to 100 parts by mass of the polymer.

The film of the invention may contain any of additives such as highly dielectric inorganic particles, a reinforcing filler, and an affinity improver.

Examples of the affinity improver include coupling agents, functional group-modified polyolefin, styrene-modified polyolefin, functional group-modified polystyrene, polyacrylate imide, and cumyl phenol. The affinity improver can be added in an amount that does not impair the effects of the invention. In terms of withstand voltage, it is better not to add these components.

The film of the invention, for example, can suitably be produced by a production method including melt extruding a polymer to provide a film and stretching the film to provide a stretched film.

The melt extrusion may be performed at 250° C. to 380° C.

The melt extrusion may be performed using a melt extruder. The cylinder temperature is preferably 250° C. to 350° C. and the die temperature is preferably 300° C. to 380° C.

Preferably, the production method may also include winding the film obtained by the extrusion on a roll. The roll temperature is preferably 0° C. to 180° C.

The film obtained by the extrusion is stretched to provide a stretched film.

The stretching may be uniaxial stretching or biaxial stretching. The biaxial stretching may be sequential biaxial stretching or simultaneous biaxial stretching.

In the uniaxial stretching, the film is stretched in the machine direction (MD) that is the same direction as the direction of extruding the polymer in the extrusion.

The uniaxial stretching is preferably performed at a stretch ratio of 4.5 times or more, more preferably 5.0 times or more, still more preferably 9.0 times or more.

The uniaxial stretching is preferably performed at a stretching temperature of 0° C. to 180° C., more preferably 40° C. or higher, while more preferably 120° C. or lower.

The stretching speed in the uniaxial stretching is preferably 1E+2 to 1E+5%/min.

The biaxial stretching stretches the film in the machine direction (MD) and the transverse direction (TD) perpendicular thereto.

The stretch ratio in the biaxial stretching is preferably 2.0 to 10 times, more preferably 2.5 times or more, still more preferably 3.0 times or more, particularly preferably 4.0 times or more, further more preferably 5.0 times or more, for each of MD and TD.

The stretching temperature in the biaxial stretching is preferably 0° C. to 180° C., more preferably 20° C. or higher, still more preferably 40° C. or higher, while preferably 120° C. or lower.

The stretching speed in the biaxial stretching is preferably 1E+2 to 1E+5%/min.

The biaxial stretching may be either sequential biaxial stretching or simultaneous biaxial stretching.

The biaxial stretching may be tenter biaxial stretching or tubular biaxial stretching, for example. Tenter biaxial stretching is preferred.

The sequential biaxial stretching is a technique in which, usually, the film is stretched in the machine direction (MD) utilizing the rotational differences between rolls, and then the rolled film is stretched in TD with the ends (in TD) held by clips. In some cases, the film may be stretched in MD in the order of MD stretching, TD stretching, and MD stretching.

The simultaneous biaxial stretching is a technique in which the ends (in TD) of a rolled film are held by clips, and the distance between the clips is increased in both MD and TD so that the film is stretched.

The stretching is preferably performed on a single layer film in the following conditions: the area ratio is 4.5 times or more, the thickness of the raw film is 300 µm or less, and the thickness variation of the raw film is 10% or less.

Use of a specific polymer is found to reduce the dielectric dissipation factor at high temperatures. Stretching the polymer at an area ratio of 4.5 times or more is found to enable the polymer to have a crystallinity of 65% or higher. Thereby, the resulting film can have a much better dielectric breakdown strength and volume resistivity.

The area ratio is preferably 5.0 times or more, more preferably 6.0 times or more, still more preferably 6.5 times or more, particularly preferably 9.0 times or more, further more preferably 16 times or more, most preferably 25 times or more. Such a high area ratio achieves a higher crystallinity and an improved volume resistivity and dielectric breakdown strength.

The raw film refers to a film before stretching and may be a film obtained by the extrusion, for example.

The production method may also preferably include heat setting the stretched film obtained. The heat setting can reduce shrinkage of the film due to factors such as heat, and can improve the durability.

The heat-setting temperature is preferably 100° C. to 250° C., more preferably 150° C. or higher and 230° C. or lower. The heat-setting duration may be short, and may be 5 minutes or shorter in continuous stretching.

The film of the invention has a low dielectric dissipation factor and an excellent volume resistivity and dielectric breakdown strength at high temperatures, and thus can be used in various applications.

For example, the film can be used in a film capacitor, an electrowetting device, a circuit board, an electric wire cable, a high frequency printed circuit board, a sealing material for an electronic component, or for electric insulation in a motor or transformer.

The film of the invention can be suitably used as a film of a film capacitor. A film capacitor including the film of the invention is also an aspect of the invention.

The film capacitor may include the film of the invention and an electrode layer provided on at least one side of the film.

Examples of the structure of a film capacitor include: laminated structures in which electrode layers and films are alternately stacked (for example, those disclosed in JP S63-181411 A and JP H03-18113 A); and rolled structures in which a tape-shaped film and a tape-shaped electrode layer are rolled up together (for example, one disclosed in JP S60-262414 A in which electrodes are not continuously stacked on a film, and one disclosed in JP H03-286514 A in which electrodes are continuously stacked on a film). For rolled film capacitors in which electrodes are continuously stacked on a film, which are relatively easily producible and have a simple structure, generally, two films each having an electrode stacked on one side thereof are rolled up together such that the electrodes do not contact each other, and then these films are fixed as appropriate so as not to be loosened, whereby a rolled film capacitor is produced.

The electrode layer may be any layer, and is usually a conductive metal layer made of aluminum, zinc, gold, platinum, copper, or the like. It is used in the form of metal foil or a deposited metal film. Metal foil or a deposited metal film may be used alone or both may be used in combination. Usually, a deposited metal film is preferred because a thin electrode layer can be obtained with a higher capacity for its volume, excellent adhesion to a dielectric film, and a small variation in thickness. A deposited metal film is not limited to a single layer, and it may be a multi-layer, if necessary, which can be obtained by, for example, a method in which a semi-conductive aluminum oxide layer is formed on an aluminum layer so as to give moisture resistance, thereby producing an electrode layer (for example, JP H02-250306 A). The thickness of the deposited metal film is also not limited, and is preferably 100 to 2000 angstrom, more preferably 200 to 1000 angstrom. The deposited metal film having a thickness within this range is suitable because the capacity and strength of the capacitor are balanced.

When a deposited metal film is used as an electrode layer, the film may be formed by any method, such as vacuum deposition, sputtering, or ion plating. Usually, vacuum deposition is used.

There are several types of vacuum deposition, such as batch type for molded articles, and semi-continuous type and continuous (air to air) type for long-size articles. Currently, semi-continuous vacuum deposition is the mainstream. The semi-continuous metal deposition is a method in which a metal is deposited and coiled in a vacuum system which is then brought back to atmospheric pressure, and the deposited film is taken out.

The semi-continuous metal deposition may be performed specifically by the method described with reference to FIG. 1 in JP 3664342 B.

In the case of forming a thin metal layer on the film, the film surface may be subjected to a pretreatment such as corona treatment or plasma treatment so as to improve the adhesion. In the case of using metal foil as an electrode layer, the thickness of the metal foil is, although not limited, usually 0.1 to 100 μm, preferably 1 to 50 μm, more preferably 3 to 15 μm.

The fixing may be performed by any method. For example, a resin may be used to seal the structure or an insulation case may be used to encapsulate the structure, so that the structure can be fixed and protected at the same time. Also, a lead wire may be connected by any method, such as welding, ultrasonic pressure welding, thermal pressure welding, or fixing with adhesive tape. The lead wire may be connected to an electrode before rolling up. For example, in the case of encapsulation in an insulation case, if necessary, an opening may be sealed with a thermosetting resin such as urethane resin or epoxy resin to prevent oxidative degradation.

The film of the invention has an excellent volume resistivity and dielectric breakdown strength at high temperatures and is thus particularly suitable for film capacitors used as peripheral members of power semiconductors.

Examples of the power semiconductor include diodes, transistors, and integrated circuits (ICs). The film is particularly suitable to a dielectric film of a film capacitor that is used as a peripheral member of a power semiconductor including a silicon carbide (SiC) semiconductor usable at high temperatures.

The film of the invention can also be suitably used as a dielectric film of an electrowetting device. An electrowetting device including the film of the invention is also an aspect of the invention.

The electrowetting device may include a first electrode, a second electrode, a conductive liquid movably contained between the first electrode and the second electrode, and the film (dielectric film) of the invention between the first electrode and the conductive liquid so as to insulate the first electrode from the second electrode. The film of the invention may have a water-repellent layer thereon. In addition to the conductive liquid, an insulating liquid may be held between the first electrode and the second electrode, and the conductive liquid and the insulating liquid may together form a bi-layer.

The electrowetting device may be used in optical elements, display devices (displays), varifocal lenses, light modulating devices, optical pickup devices, optical recording/reproducing devices, developing devices, droplet dispensers, and analytical instruments (such as chemical, biochemical, and biological analytical instruments which require movement of a small amount of conductive liquid to analyze samples).

EXAMPLES

The invention is described below with reference to examples, but the invention is not limited to these examples.

The parameters in the examples were determined by the following methods.

Monomer Composition of Fluoropolymer

The monomer composition was determined by $^{19}$F-NMR at a measurement temperature set to (melting point of the polymer+20)° C. using a nuclear magnetic resonance device. Elemental analyses were appropriately combined for measurement, depending on the integral value of each peak and the type of the monomers.

Melting Point

The melting point was determined from the peak on an endothermic curve obtained by thermal analysis at a temperature-increasing rate of 10° C./min using a differential scanning calorimeter in conformity with ASTM D-4591.

Film Thickness

The thickness of the film placed on a substrate was measured at room temperature using a digital thickness meter.

Crystallinity

The crystallinity of the film was determined by multiple peak separation using an X-ray diffractometer. Specifically, films were stacked to provide a measurement sample having a total thickness of 40 μm or greater. This measurement sample was mounted on a sample holder, and a diffraction spectrum was obtained by an X-ray diffractometer. The peaks of the crystal portion and amorphous portion in the diffraction spectrum were resolved into independent peaks. The crystallinity was calculated from the integral intensity (area) of each peak.

In Examples 1 to 5 and Comparative Examples 1 to 3, the peaks in a range of 10° to 50° in the obtained diffraction spectrum were resolved by multiple peak separation. The crystallinity was calculated from the proportional integral intensity of the peak of the crystal portion in the integral intensity of all the peaks.

Melt Flow Rate (MFR)

The MFR was defined as the mass (g/10 min) of a polymer that flows out of a nozzle (inner diameter: 2 mm, length: 8 mm) per 10 minutes at 297° C. and a 5-kg load in conformity with ASTM D3307-01.

Relative Permittivity

Aluminum was deposited on both sides of the film in vacuo to prepare a sample. The capacitance of the sample was measured at a frequency of 1 kHz at 30° C. and 160° C. using an LCR meter. The relative permittivity was calculated from the measured capacitance values.

Dielectric Dissipation Factor

First, aluminum was deposited on both sides of the film in vacuo to prepare a sample. The dielectric dissipation factor of the sample was measured at a frequency of 1 kHz at 30° C. and 160° C. using an LCR meter.

Volume Resistivity

The film was held between a lower electrode and an upper electrode placed in a constant temperature chamber and an electric field at 50 V/μm was applied to the film using a digital super megohmmeter/microammeter. The leak current was measured, and thereby the volume resistivity was calculated. The measurement was performed in the constant temperature chamber set to 160° C.

Dielectric Breakdown Strength

The film was placed on a lower electrode and a 500-g weight having a diameter of 25 mm was placed thereon as an upper electrode. A voltage applied between the ends was increased at a rate of 100 V/sec, and the voltage at break was measured. The number of measurement operations was 50. The measured values of the respective operations, excluding the five highest values and the five lowest values, were averaged. This average was divided by the thickness, whereby the dielectric breakdown strength was obtained. The measurement was performed in a constant temperature chamber (160° C., 25% RH), whereby the dielectric breakdown strength at 160° C. was measured.

Following are the resins used in the examples.
PFA: a TFE/PPVE copolymer, number of unstable terminal groups: 110 to 400 per $10^6$ carbon atoms, melting point: 305° C., relative permittivity: 2.1
PP (polypropylene) film: a stretched film having a thickness of 2.8 μm Example 1

The PFA was formed into a film using a melt extruder to provide a film having a thickness of 100 μm. The 100-μm-thick film was stretched to 2.5 times in both MD and TD at a temperature of 80° C. and a speed of 1E+2 to 1E+5%/min using a biaxial stretching device, whereby a stretched film having a thickness of 8 to 10 μm was obtained.

Example 2

The PFA was formed into a film using a melt extruder to provide a film having a thickness of 50 μm. The 50-μm-thick film was stretched to 4.0 times in both MD and TD at a temperature of 40° C. and a speed of 1E+2 to 1E+5%/min using a biaxial stretching device, whereby a stretched film having a thickness of 8 to 10 μm was obtained.

Example 3

The PFA was formed into a film using a melt extruder to provide a film having a thickness of 50 μm. The 50-μm-thick film was stretched to 4.0 times in both MD and TD at a temperature of 60° C. and a speed of 1E+2 to 1E+5%/min using a biaxial stretching device, whereby a stretched film having a thickness of 8 to 10 μm was obtained.

Example 4

The PFA was formed into a film using a melt extruder to provide a film having a thickness of 50 μm. The 50-μm-thick film was stretched to 4.0 times in both MD and TD at a temperature of 80° C. and a speed of 1E+2 to 1E+5%/min using a biaxial stretching device, whereby a stretched film having a thickness of 8 to 10 μm was obtained.

Example 5

The PFA was formed into a film using a melt extruder to provide a film having a thickness of 50 μm. The 50-μm-thick film was stretched to 4.0 times in both MD and TD at a temperature of 100° C. and a speed of 1E+2 to 1E+5%/min using a biaxial stretching device, whereby a stretched film having a thickness of 8 to 10 μm was obtained.

Comparative Example 1

The PFA was formed into a film using a melt extruder to provide a film having a thickness of 12.5 μm.

Comparative Example 2

A FEP was formed into a film using a melt extruder, and the film was processed using a T-die molding extruder, whereby a 50-μm-thick film was obtained. The film was stretched to 2.0 times in both MD and TD at a temperature of 90° C. using a biaxial stretching device, whereby a stretched film having a thickness of 12.5 μm was obtained.

Comparative Example 3

The PP film was used.

Each of the obtained films was determined or measured for the relative permittivity, dielectric dissipation factor, volume resistivity, dielectric breakdown strength, and crystallinity. The results are shown in Table 1.

TABLE 1

|  | Example | | | | | Comparative Example | | |
| --- | --- | --- | --- | --- | --- | --- | --- | --- |
|  | 1 | 2 | 3 | 4 | 5 | 1 | 2 | 3 |
| Film composition | PFA | PFA | PFA | PFA | PFA | PFA | FEP | PP |
| Relative permittivity | | | | | | | | |
| 30° C., 1 kHz | 2.1 | 2.1 | 2.1 | 2.1 | 2.1 | 2.1 | 2.1 | 2.2 |
| 160° C., 1 kHz | 2.1 | 2.1 | 2.1 | 2.1 | 2.1 | 2.0 | 2.0 | Unmeasurable |
| Dielectric dissipation factor (%) | | | | | | | | |
| 30° C., 1 kHz | <0.02 | <0.02 | <0.02 | <0.02 | <0.02 | <0.02 | <0.02 | 0.03 |
| 160° C., 1 kHz | <0.02 | <0.02 | <0.02 | <0.02 | <0.02 | <0.02 | <0.02 | Unmeasurable |
| Volume resistivity (Ω·cm) | | | | | | | | |
| 160° C. 50 V/μm | 1.00E+17 | 1.00E+17 | 1.00E+17 | 1.00E+17 | 1.00E+17 | 1.00E+14 | 1.00E+15 | Unmeasurable |
| Dielectric breakdown strength (V/μm) | | | | | | | | |
| 160° C. | 400 | 400 | 400 | 400 | 400 | 201 | 254 | Unmeasurable |
| Crystallinity (%) | 65 | 80 | 80 | 80 | 80 | 35 | 60 | 85 |

The invention claimed is:

1. A film having a dielectric dissipation factor at a frequency of 1 kHz and 160° C. of 0.02% or lower and a dielectric breakdown strength at 160° C. of 400 V/μm or higher,
   wherein the film comprises at least one fluoropolymer selected from the group consisting of a tetrafluoroethylene/perfluoro(alkyl vinyl ether) copolymer and a tetrafluoroethylene/hexafluoropropylene copolymer.

2. The film according to claim 1, having a volume resistivity at 160° C. of 1.0E16 Ω·cm or more.

3. The film according to claim 1,
   wherein the fluoropolymer has a crystallinity of 65% or higher.

4. The film according to claim 1,
   wherein the fluoropolymer has a melting point of 270° C. or higher.

5. The film according to claim 1,
   wherein the fluoropolymer has a relative permittivity of 2.5 or lower.

6. The film according to claim 1, having a thickness of 1 to 100 μm.

7. The film according to claim 1,
   wherein the film is intended to be used in a film capacitor, an electrowetting device, a circuit board, an electric wire cable, a high frequency printed circuit board, a sealing material for an electronic component, or for electric insulation in a motor or transformer.

\* \* \* \* \*